United States Patent
Chung et al.

(10) Patent No.: US 10,230,067 B2
(45) Date of Patent: Mar. 12, 2019

(54) ORGANIC LIGHT EMITTING DISPLAY DEVICE

(71) Applicant: Samsung Display Co., Ltd., Yongin-si, Gyeonggi-do (KR)

(72) Inventors: Jin-Koo Chung, Suwon-si (KR); Seong-Min Kim, Yongin-si (KR); Eun-Kyoung Nam, Hwaseong-si (KR); Jin-Hyun Park, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/707,664

(22) Filed: Sep. 18, 2017

(65) Prior Publication Data

US 2018/0083217 A1   Mar. 22, 2018

(30) Foreign Application Priority Data

Sep. 21, 2016 (KR) .......................... 10-2016-0120833

(51) Int. Cl.
*H01L 51/52* (2006.01)
*G09G 3/3208* (2016.01)
*H01L 27/32* (2006.01)

(52) U.S. Cl.
CPC ....... *H01L 51/5203* (2013.01); *G09G 3/3208* (2013.01); *H01L 27/3276* (2013.01); *H01L 51/5237* (2013.01); *G09G 2300/0426* (2013.01)

(58) Field of Classification Search
CPC ................................................. H01L 27/3276
See application file for complete search history.

(56) References Cited

U.S. PATENT DOCUMENTS

| 2003/0094615 A1* | 5/2003 | Yamazaki | H01L 27/12 257/72 |
| 2006/0113900 A1* | 6/2006 | Oh | H01L 27/3276 313/504 |
| 2009/0008642 A1* | 1/2009 | Kim | H01L 27/3276 257/59 |
| 2009/0309489 A1* | 12/2009 | Takata | H01L 27/3246 313/504 |
| 2013/0140536 A1* | 6/2013 | Yamazaki | H01L 27/3244 257/40 |
| 2015/0115234 A1* | 4/2015 | Hong | H01L 51/525 257/40 |

(Continued)

*Primary Examiner* — Caridad Everhart
*Assistant Examiner* — Ankush Singal
(74) *Attorney, Agent, or Firm* — Innovation Counsel LLP

(57) ABSTRACT

An organic light emitting display (OLED) device is disclosed. The OLED device may include a substrate comprising a display region and a peripheral region, the display region comprising a first transmission portion and at least one light emitting portion, the peripheral region comprising a second transmission portion and at least one electrode placement portion, a first electrode in the display region, an organic light emitting layer on the first electrode, a second electrode in the display region and the peripheral region, the second electrode opposite to the first electrode with respect to the organic light emitting layer, and a third electrode in the peripheral region. The first electrode may be patterned as an island shape to be separated per the light emitting portion. The third electrode may be patterned as an island shape to be separated per the electrode placement portion.

20 Claims, 9 Drawing Sheets

(56) References Cited

U.S. PATENT DOCUMENTS

| | | | | |
|---|---|---|---|---|
| 2015/0116295 A1* | 4/2015 | Pyon | .................... | H01L 51/5203 |
| | | | | 345/211 |
| 2016/0086977 A1* | 3/2016 | Go | ........................ | H01L 27/124 |
| | | | | 257/773 |
| 2016/0093641 A1* | 3/2016 | Takahashi | ........... | H01L 27/1225 |
| | | | | 257/43 |
| 2016/0149165 A1* | 5/2016 | Kim | .................... | H01L 51/5284 |
| | | | | 257/40 |
| 2016/0204184 A1* | 7/2016 | Park | ..................... | H01L 27/124 |
| | | | | 257/71 |
| 2017/0005155 A1* | 1/2017 | You | .................... | H01L 27/3258 |
| 2017/0110521 A1* | 4/2017 | Park | .................... | H01L 27/326 |
| 2017/0148391 A1* | 5/2017 | Pyon | .................... | H01L 51/5203 |
| 2017/0162637 A1* | 6/2017 | Choi | .................... | H01L 27/3246 |
| 2017/0200740 A1* | 7/2017 | Kang | .................... | H01L 27/124 |
| 2017/0229529 A1* | 8/2017 | Jung | .................... | H01L 27/3258 |
| 2017/0287995 A1* | 10/2017 | Kim | .................... | H01L 27/3258 |
| 2018/0083087 A1* | 3/2018 | Choi | .................... | H01L 51/5228 |
| 2018/0102502 A1* | 4/2018 | Kim | ........................ | H01L 22/12 |

\* cited by examiner

ORGANIC LIGHT EMITTING DISPLAY DEVICE

CROSS-REFERENCE TO RELATED APPLICATION(S)

This application claims priority under 35 USC § 119 to Korean Patent Application No. 10-2016-0120833, filed on Sep. 21, 2016 in the Korean Intellectual Property Office (KIPO), the entire disclosure of which is incorporated by reference herein.

BACKGROUND

1. Field

Exemplary embodiments relate to display devices. More particularly, exemplary embodiments relate to organic light emitting display (OLED) devices that decrease or substantially prevent a pixel shrinkage.

2. Description of the Related Art

A display device may display an image based on lights emitted from a plurality of pixels. An organic light emitting display (OLED) device may include a pixel including an organic light emitting element and a pixel circuit. The organic light emitting element may output light having a wavelength that corresponds to an organic material included in the organic light emitting element. For example, the organic light emitting element may include organic materials each corresponding to a red light, green light or blue light, and the OLED device may display an image by combining lights emitted from the organic materials. The pixel circuit may transmit a driving current for driving the organic light emitting element.

A passivation layer covering the pixel circuit may be formed in the OLED device. The organic light emitting element may be formed on the passivation layer.

Recently, research has been progressing on a transparent OLED device in which the pixel circuit and/or the organic light emitting element may be transparent.

SUMMARY

An object of the present inventive concept is to provide an organic light emitting display (OLED) device that decreases or substantially prevents a pixel shrinkage as well as effectively induces an out-gassing.

In order to achieve the object of the present inventive concept described above, an OLED device according to exemplary embodiments may include a substrate including a display region and a peripheral region surrounding at least one side of the display region, the display region including a first transmission portion and at least one light emitting portion, the peripheral region including a second transmission portion and at least one electrode placement portion, a pixel circuit on the substrate in the display region, a passivation layer in the display region and the peripheral region, the passivation layer covering the pixel circuit, a first electrode on the passivation layer in the display region, the first electrode being electrically connected to the pixel circuit, an organic light emitting layer on the first electrode, a second electrode in the display region and the peripheral region, the second electrode opposite to the first electrode with respect to the organic light emitting layer, and a third electrode on the passivation layer in the peripheral region. The first electrode may be patterned as an island shape to be separated per the at least one light emitting portion. The third electrode may be patterned as an island shape to be separated per the at least one electrode placement portion.

In an exemplary embodiment, the third electrode may not be overlapped with the second transmission portion.

In an exemplary embodiment, the first electrode and the third electrode may be disposed on substantially the same level on the substrate and formed of substantially the same material.

In an exemplary embodiment, the OLED device may further include a voltage transmissive line disposed in a wiring portion in the peripheral region, the voltage transmissive line transmitting a common voltage to the second electrode.

In an exemplary embodiment, the voltage transmissive line may not be overlapped with the second transmission portion.

In an exemplary embodiment, the pixel circuit may include an active pattern, a gate electrode insulated from the active pattern, and source and drain electrodes each connected to the active pattern. The voltage transmissive line, and the source and drain electrodes may be disposed on substantially the same level on the substrate and formed of substantially the same material.

In an exemplary embodiment, the third electrode may include a voltage transmissive electrode disposed in the wiring portion and an auxiliary electrode disposed in the peripheral region outside the wiring portion. The voltage transmissive electrode may be disposed between the voltage transmissive line and the second electrode to electrically connect the voltage transmissive line and the second electrode.

In an exemplary embodiment, the OLED device may further include a driving circuit in the peripheral region.

In an exemplary embodiment, the driving circuit may include at least one of a scan driving circuit, a light emitting control circuit, and an initialization voltage transmissive line.

In an exemplary embodiment, the driving circuit may not be overlapped with the second transmission portion.

In an exemplary embodiment, at least a portion of the auxiliary electrode may be overlapped with the driving circuit.

In another exemplary embodiment, the third electrode may be disposed between the voltage transmissive line and the second electrode to electrically connect the voltage transmissive line and the second electrode.

In another exemplary embodiment, the third electrode may be disposed only in the wiring portion, and may not be disposed in a remaining portion of the peripheral region, the remaining portion being outside the wiring portion.

In an exemplary embodiment, an area of the first transmission portion may be substantially the same area as an area of the second transmission portion.

In order to achieve the object of the present inventive concept described above, an OLED device according to some exemplary embodiments may include a display region, a peripheral region surrounding at least one side of the display region, a first transmission portion in the display region, a first light emitting portion spaced apart from the first transmission portion in the display region, the first light emitting portion including a first electrode, an organic light emitting layer, and a second electrode, a second transmission portion in the peripheral region, and a first electrode placement portion spaced apart from the second transmission portion in the peripheral region, the first electrode placement portion including a third electrode. A distance between the second transmission portion and the first electrode placement portion may be substantially the same distance as a distance between the first transmission portion and the first light emitting portion.

In an exemplary embodiment, a shape of the second transmission portion and a shape of the first electrode placement portion may respectively each be of the same shapes as a shape of the first transmission portion and a shape of the first light emitting portion.

In an exemplary embodiment, the OLED device may further include a second light emitting portion spaced apart from the first transmission portion and the first light emitting portion in the display region, the second light emitting portion comprising the first electrode, the organic light emitting layer, and the second electrode, and a second electrode placement portion spaced apart from the second transmission portion and the first electrode placement portion in the peripheral region, the second electrode placement portion including the third electrode.

In an exemplary embodiment, a distance between the second transmission portion and the second electrode placement portion may be substantially the same distance as a distance between the first transmission portion and the second light emitting portion.

In an exemplary embodiment, a distance between the first electrode placement portion and the second electrode placement portion may be substantially the same distance as a distance between the first light emitting portion and the second light emitting portion.

In an exemplary embodiment, a shape of the first electrode placement portion and a shape of the second electrode placement portion may respectively each be of the same as a shape of the first light emitting portion and a shape of the second light emitting portion.

The OLED device according to exemplary embodiments of the present inventive concept may include the third electrode patterned as an island shape in the peripheral region thereby decreasing or substantially preventing a pixel shrinkage as well as effectively inducing an out-gassing.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, an organic light emitting display (OLED) device in accordance with exemplary embodiments of the present inventive concept will be explained in detail with reference to the accompanying drawings.

Figure 1:
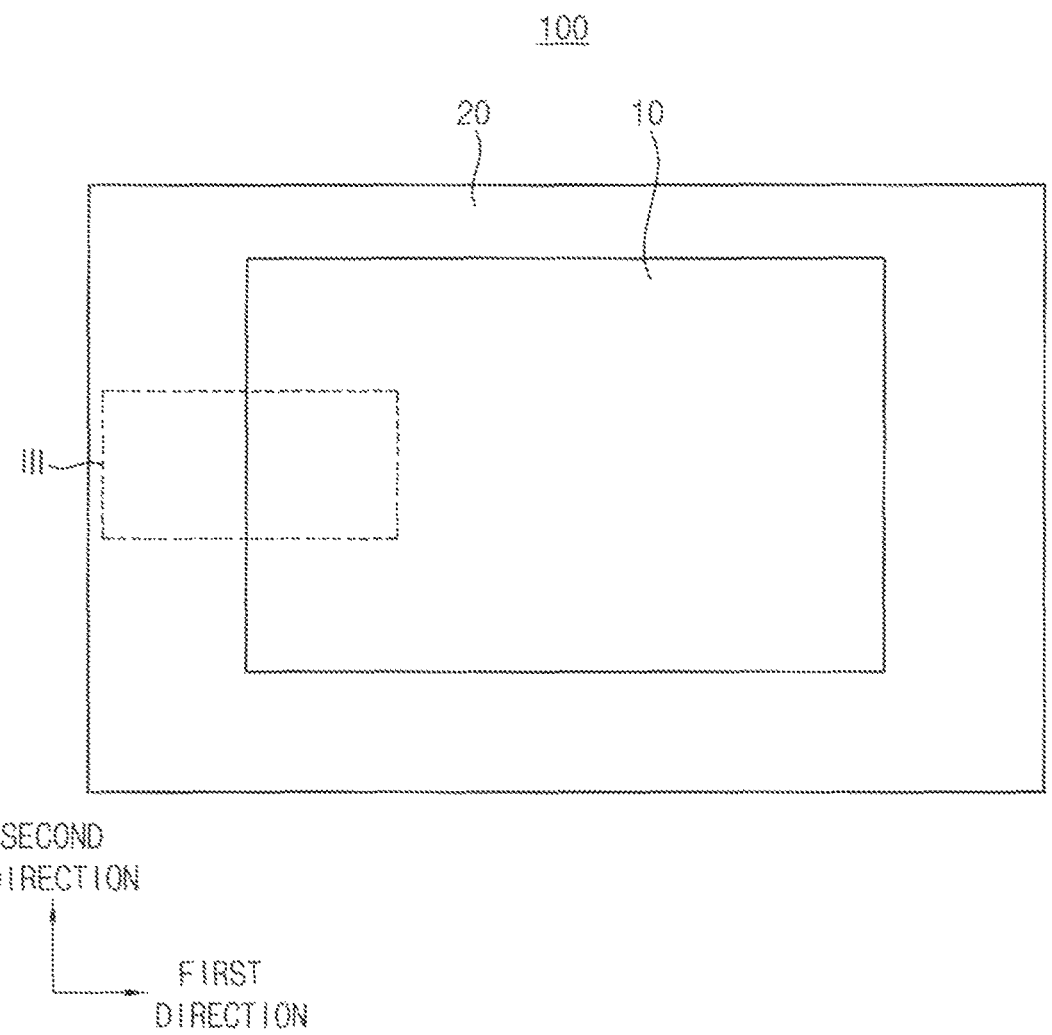
FIG. 1 is a plan view illustrating a substrate of an OLED device according to an exemplary embodiment of the present inventive concept.
Figure 2:
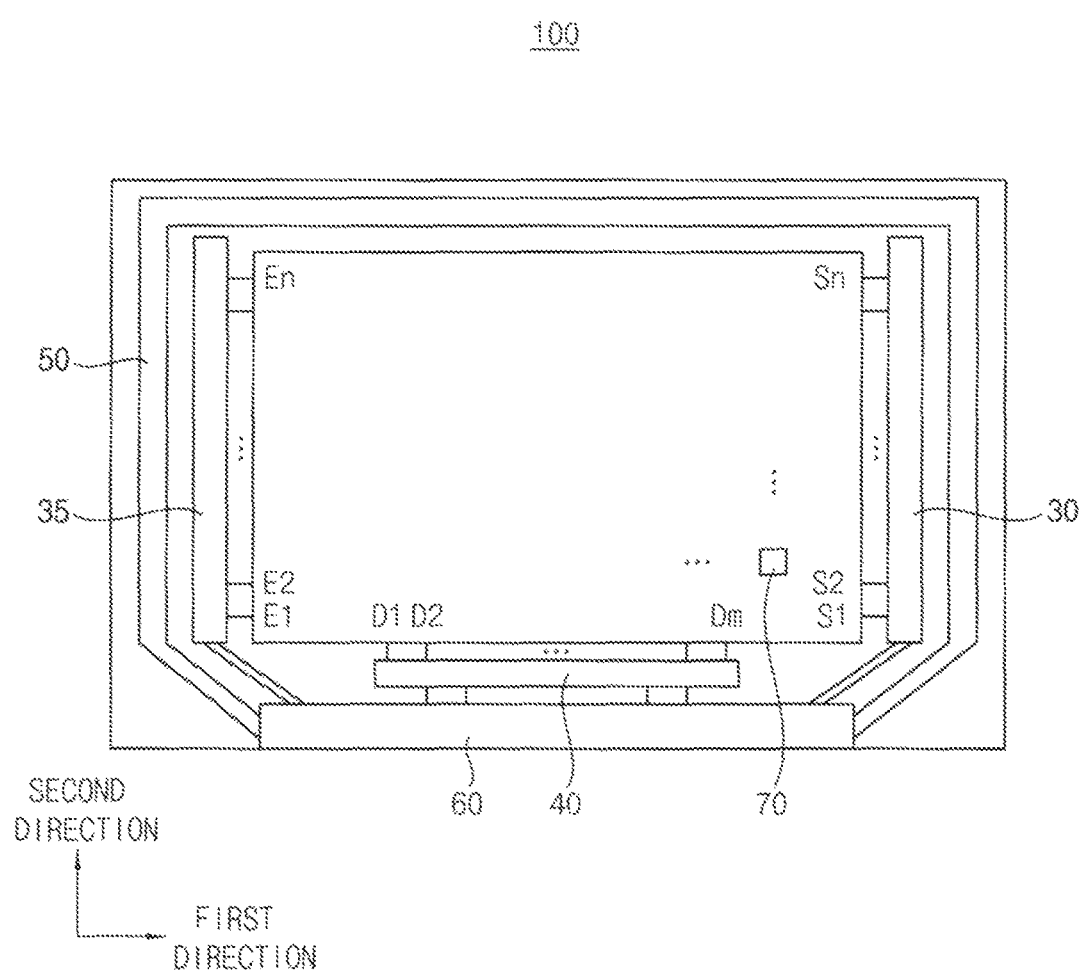
FIG. 2 is a plan view illustrating an OLED device according to an exemplary embodiment of the present inventive concept.
Figure 3:
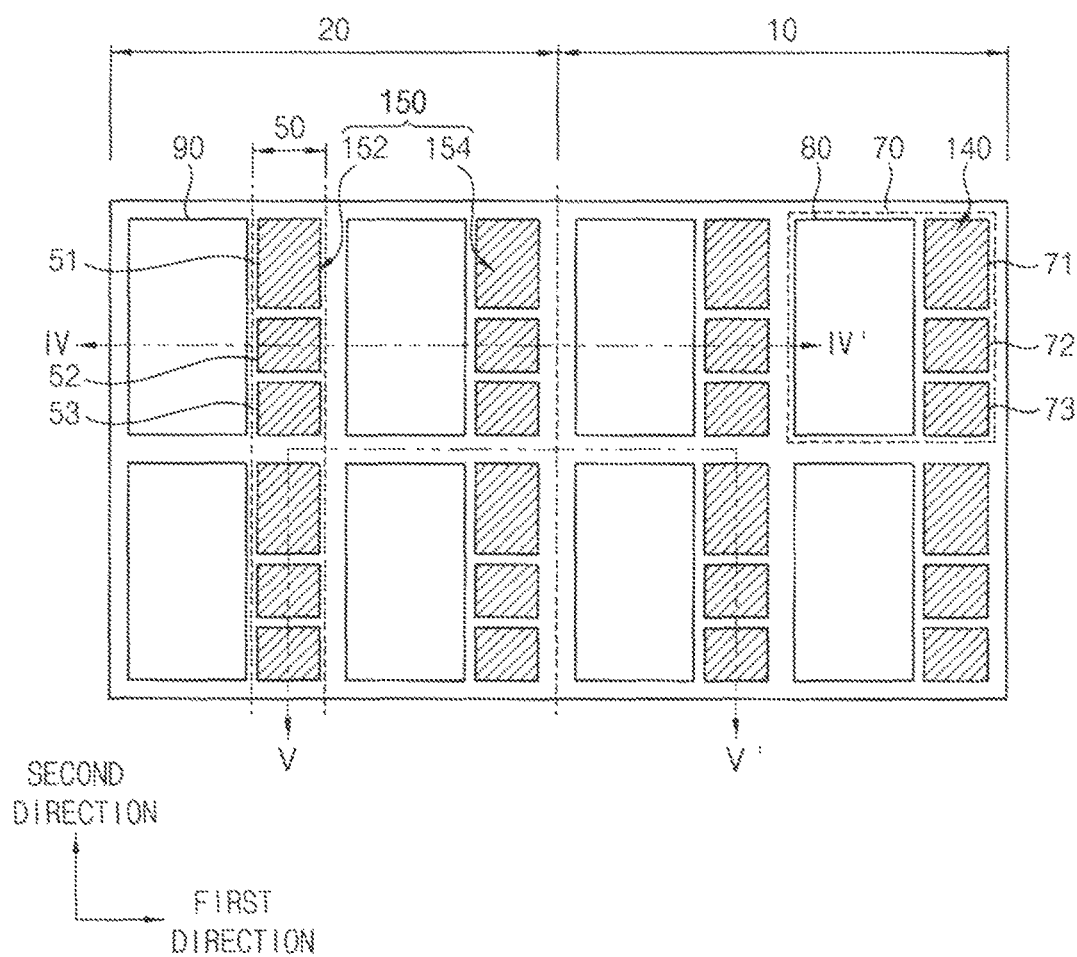
FIG. 3 is a plan view enlarging a portion III in FIG. 1 to describe an OLED device according to an exemplary embodiment of the present inventive concept.
Figure 4:
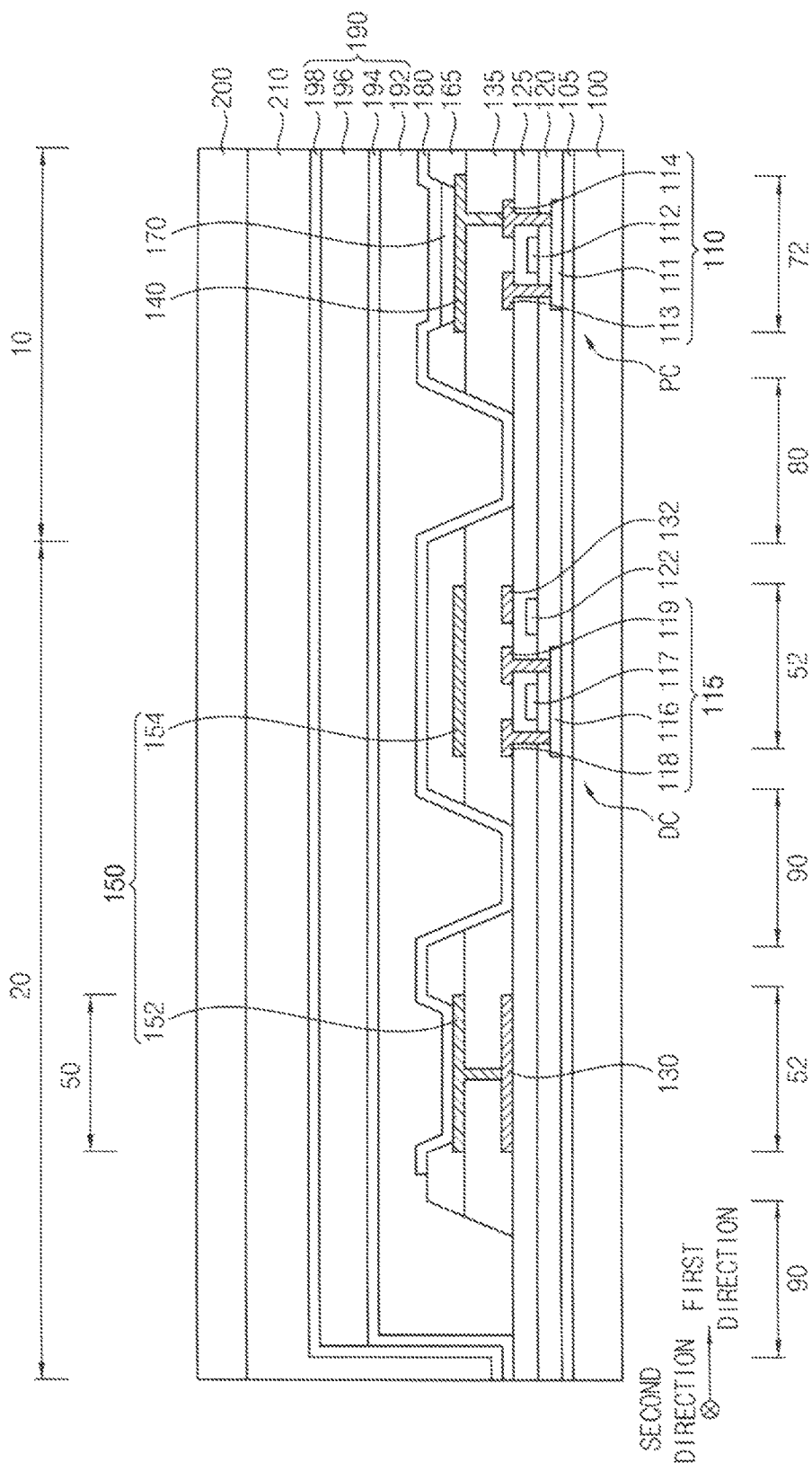
FIG. 4 is a cross-sectional view cut along a line IV-IV' in FIG. 3.
Figure 5:
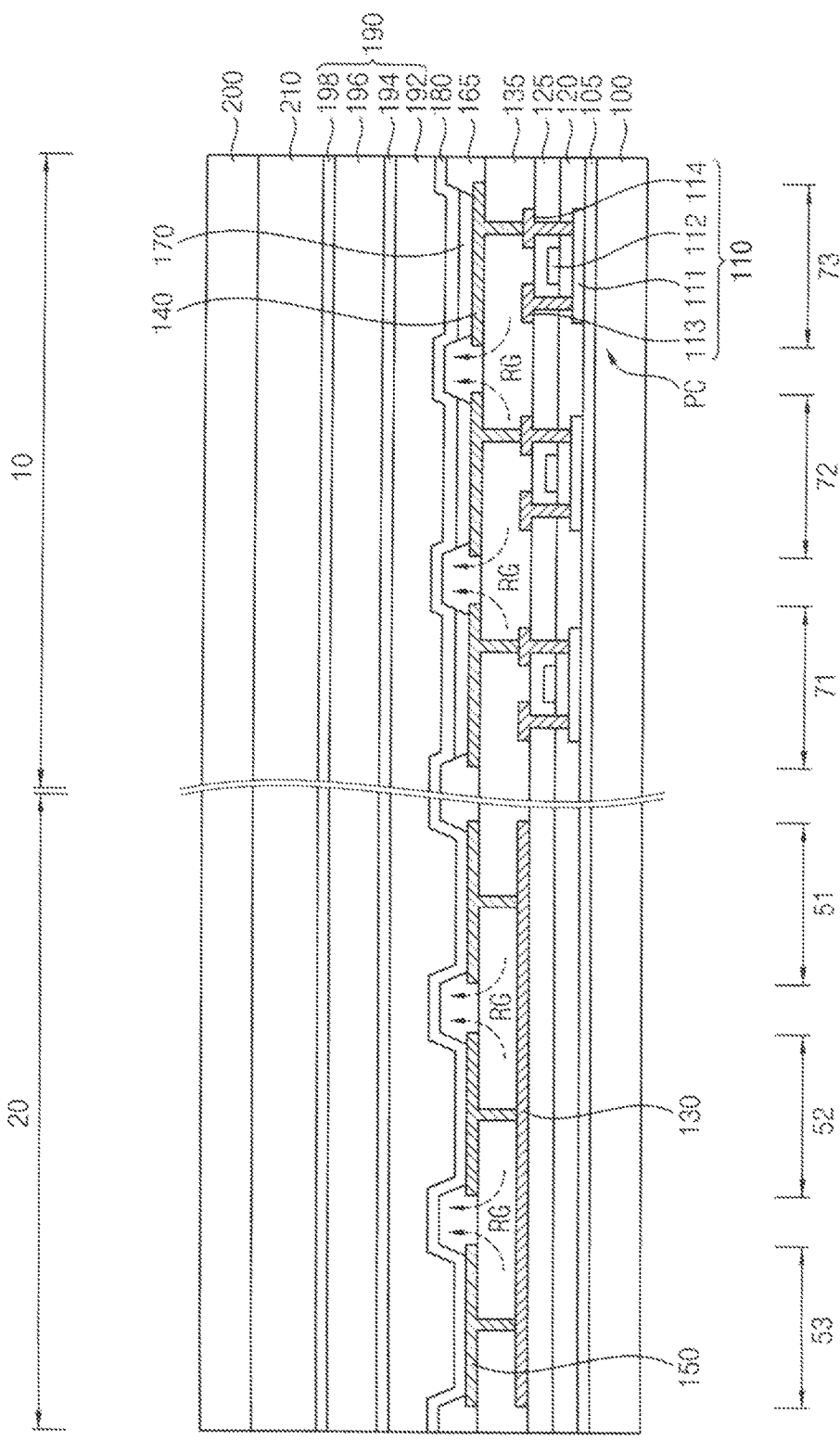
FIG. 5 is a cross-sectional view cut along a line V-V' in FIG. 3.

FIGS. 1 to 5 are plan views and cross-sectional views for describing an OLED device according to an exemplary embodiment. That is, FIG. 1 is a plan view illustrating a substrate of an OLED device according to an exemplary embodiment of the present inventive concept, and FIG. 2 is a plan view illustrating an OLED device according to an exemplary embodiment of the present inventive concept. FIG. 3 is a plan view enlarging a portion III in FIG. 1 to describe an OLED device according to an exemplary embodiment of the present inventive concept. FIG. 4 is a cross-sectional view cut along a line IV-IV' in FIG. 3, and FIG. 5 is a cross-sectional view cut along a line V-V' in FIG. 3.

Referring to FIG. 1, a substrate 100 may include a display region 10 and a peripheral region 20. The substrate 100 may have various planar shapes depending on a shape of the OLED device. For example, when the OLED device has a rectangular shape, the substrate 100 may also have the rectangular shape. In an exemplary embodiment, the substrate 100 may have a rectangular shape extending in a first direction.

The display region 10 may be disposed at a central portion of the substrate 100. The display region 10 may display an image. The display region 10 may have a planar shape depending on the substrate 100. For example, when the substrate 100 has the rectangular shape, the display region 10 may also have the rectangular shape.

The peripheral region 20 may be disposed at an edge portion of the substrate 100. The peripheral region 20 may surround at least one side of the display region 10. For example, the peripheral region 20 may surround four sides of the display region 10 as illustrated in FIG. 1.

Referring to FIG. 2, the OLED device may include the substrate 100, a plurality of pixel regions 70, a scan driving circuit 30, a light emitting control circuit 35, a data driving circuit 40, a wiring portion 50, and a pad portion 60.

The plurality of pixel regions 70 may be disposed in the display region 10 of the substrate 100. Each of the pixel regions 70 may be arranged in the first direction and a second direction substantially perpendicular to the first direction, thereby forming a matrix structure. A detailed structure of each of the pixel regions 70 will be described below with reference to FIG. 3. The plurality of pixel regions 70 may be arranged where scan lines (S1 to Sn), light emitting control lines (E1 to En), and data lines (D1 to Dm) cross each other.

The scan driving circuit 30 may be disposed in the peripheral region 20 of the substrate 100. For example, the scan driving circuit 30 may be disposed at a left side or a right side of the plurality of pixel regions 70. The scan driving circuit 30 may generate a scan signal in response to a driving power signal and a control signal supplied from an external portion, and may sequentially supply the scan signal to the scan lines (S1 to Sn). Therefore, the plurality of pixel regions 70 may be selected by the scan signal, and may receive a data signal during a selected period.

The light emitting control circuit 35 may be disposed in the peripheral region 20 of the substrate 100. For example, the light emitting control circuit 35 may be disposed at an opposite side of the scan driving circuit 30. The light emitting control circuit 35 may generate a light emitting signal in response to a driving power signal and a control signal supplied from an external portion, and may sequentially supply the light emitting signal to the light emitting control lines (E1 to En). Therefore, the plurality of pixel regions 70 may be controlled by the light emitting signal.

The data driving circuit 40 may be disposed in the peripheral region 20 of the substrate 100. The data driving circuit 40 may generate a data signal in response to data and a control signal supplied from an external portion, and may supply the data signal to the data lines (D1 to Dm). The data signal supplied to the data lines (D1 to Dm) may be supplied to the plurality of pixel regions 70 which may be selected by the scan signal. Therefore, pixel circuits disposed in the pixel regions 70 may be charged in response to the data signal.

The wiring portion 50 may be disposed in the peripheral region 20 of the substrate 100. The wiring portion 50 may be disposed at at least one side of the plurality of pixel regions 70. For example, the wiring portion 50 may surround three sides of the plurality of pixel regions 70 as illustrated in FIG. 2. A voltage transmissive line 130 that will be described below with reference to FIG. 4 may be disposed in the wiring portion 50, and the voltage transmissive line 130 may supply a common voltage supplied from an external portion to the plurality of pixel regions 70.

The pad portion 60 may be disposed in the peripheral region 20 of the substrate 100. The pad portion 60 may be spaced apart from the plurality of pixel regions 70 with respect to the data driving circuit 40. The pad portion 60 may include a plurality of pads for supplying the driving power signal, the control signal, the data, the common voltage, an initialization voltage, etc. to an inside of the OLED device. The pad portion 60 may be electrically connected to the scan driving circuit 30, the light emitting control circuit 35, and the data driving circuit 40 through lines. Further, the pad portion 60 may transmit the common voltage to the voltage transmissive line 130 disposed in the wiring portion 50, and may transmit the initialization voltage to a first line 122 or a second line 132 which will be described below with reference to FIG. 4.

In an exemplary embodiment, the scan driving circuit 30 may be disposed at a right side of the plurality of pixel regions 70, the light emitting control circuit 35 may be disposed at a left side of the plurality of pixel regions 70, and the data driving circuit 40 and the pad portion 60 may be disposed at a bottom side of the plurality of pixel regions 70 as illustrated in FIG. 2. However, the present inventive concept is not limited thereto. For example, the scan driving circuit 30 may be disposed at the left side of the plurality of pixel regions 70, and the light emitting control circuit 35 may be disposed at the right side of the plurality of pixel regions 70.

In an exemplary embodiment, the scan driving circuit 30 and the light emitting control circuit 35 may be separated from each other with respect to the plurality of pixel regions 70. However, the present inventive concept is not limited thereto. For example, the scan driving circuit 30 and the light emitting control circuit 35 may be formed integrally. In another exemplary embodiment, the light emitting control circuit 35 may be omitted depending on the structures of the pixel region 70.

Referring to FIG. 3, the display region 10 may include the plurality of pixel regions 70, and the peripheral region 20 may include a plurality of corresponding regions which correspond to the plurality of pixel regions 70.

As described above, the display region 10 may include the plurality of pixel regions 70 that may be arranged along the first direction and the second direction. Each of the pixel regions 70 may include a first transmission portion 80 and at least one light emitting portion. For example, each of the pixel regions 70 may include the first transmission portion 80, a first light emitting portion 71, a second light emitting portion 72, and a third light emitting portion 73 as illustrated in FIG. 3. However, the number of the light emitting portions is not limited thereto.

The first transmission portion 80 may have a light transmittance substantially higher than those of other portions in the display region 10. As a plurality of the first transmission portions 80 are arranged along the first direction and the second direction, the display region 10 may have a predetermined light transmittance. In an exemplary embodiment, the first transmission portion 80 may occupy a ratio in the range of about 20% to about 90% with respect to an area of the pixel region 70. For example, the first transmission portion 80 may have a rectangular planar shape.

The first light emitting portion 71, the second light emitting portion 72, and the third light emitting portion 73 may be spaced apart from the first transmission portion 80 in the first direction. Each of the first light emitting portion 71, the second light emitting portion 72, and the third light emitting portion 73 may have a light transmittance which may be lower than that of the first transmission portion 80 and higher than those of remaining portions in the pixel region 70. The remaining portions may be outside the first transmission portion 80 in the pixel region 70.

In an exemplary embodiment, the first light emitting portion 71, the second light emitting portion 72, and the third light emitting portion 73 may correspond to a red light emitting region, a green light emitting region, and a blue light emitting region, respectively. Further, the first light emitting portion 71, the second light emitting portion 72, and the third light emitting portion 73 may have different areas.

In an exemplary embodiment, the first light emitting portion 71, the second light emitting portion 72, and the third light emitting portion 73 may extend along the first direction as illustrated in FIG. 3. Further, the first light emitting portion 71, the second light emitting portion 72, and the third light emitting portion 73 may be separated from each other in the second direction. In another exemplary embodiment, the first light emitting portion 71, the second light emitting portion 72, and the third light emitting portion 73 may extend along the second direction. Further, the first light emitting portion 71, the second light emitting portion 72, and the third light emitting portion 73 may be separated from each other in the first direction.

In another exemplary embodiment, the plurality of pixel regions 70 may share the first transmission portion 80. For example, two pixel regions 70 which are separated from each other along the second direction may share one transmission portion 80 which extends along the second direction. Thus, the light transmittance of the display region 10 may increase.

As described above, the peripheral region 20 may include the plurality of corresponding regions that correspond to the plurality of pixel regions 70 arranged along the first direction and the second direction. Each of the corresponding regions may include a second transmission portion 90 and at least one electrode placement portion. For example, each of the corresponding regions may include the second transmission portion 90, a first electrode placement portion 51, a second electrode placement portion 52, and a third electrode placement portion 53. However, the number of the electrode placement portions is not limited thereto.

The second transmission portion 90 may have a light transmittance substantially higher than those of other portions in the peripheral region 20. As a plurality of the second transmission portions 90 are arranged along the first direction and the second direction, the peripheral region 20 may have a predetermined light transmittance. For example, the second transmission portion 90 may have a rectangular planar shape.

In an exemplary embodiment, an area of the second transmission portion 90 may be substantially the same as an area of the first transmission portion 80. Therefore, a light transmittance of the peripheral region 20 may be substantially the same as a light transmittance of the display region 10.

In an exemplary embodiment, a shape of the second transmission portion 90 may be substantially the same as a shape of the first transmission portion 80. For example, the first transmission portion 80 and the second transmission portion 90 may have substantially the same rectangular shape. Accordingly, each of the second transmission portions 90 may correspond to each of the first transmission portions 80 one-to-one.

The first electrode placement portion 51, the second electrode placement portion 52, and the third electrode placement portion 53 may be spaced apart from the second transmission portion 90 in the first direction. Each of the first electrode placement portion 51, the second electrode placement portion 52, and the third electrode placement portion 53 may have a light transmittance which may be lower than that of the second transmission portion 90 and higher than those of remaining portions in the peripheral region 20. The remaining portions may be outside the second transmission portion 90 in the peripheral region 20. In an exemplary embodiment, the first electrode placement portion 51, the second electrode placement portion 52, and the third electrode placement portion 53 may have different areas.

In an exemplary embodiment, the first electrode placement portion 51, the second electrode placement portion 52, and the third electrode placement portion 53 may extend along the first direction as illustrated in FIG. 3. Further, the first electrode placement portion 51, the second electrode placement portion 52, and the third electrode placement portion 53 may be separated from each other in the second direction. In another exemplary embodiment, the first electrode placement portion 51, the second electrode placement portion 52, and the third electrode placement portion 53 may extend along the second direction. Further, the first electrode placement portion 51, the second electrode placement portion 52, and the third electrode placement portion 53 may be separated from each other in the first direction.

In an exemplary embodiment, an area of the electrode placement portion 51, 52, and 53 may be substantially the same as an area of the light emitting portion 71, 72, and 73. For example, an area of the first electrode placement portion 51, an area of the second electrode placement portion 52, and an area of the third electrode placement portion 53 may be substantially the same as an area of the first light emitting portion 71, an area of the second light emitting portion 72, and an area of the third light emitting portion 73, respectively.

In an exemplary embodiment, a shape of the electrode placement portion 51, 52, and 53 may be substantially the same as a shape of the light emitting portion 71, 72, and 73. For example, the first electrode placement portion 51, the second electrode placement portion 52, and the third electrode placement portion 53 may have rectangular shapes substantially the same as those of the first light emitting portion 71, the second light emitting portion 72, and the third light emitting portion 73, respectively, as illustrated in FIG. 3. Accordingly, each of the electrode placement portions 51, 52, and 53 may correspond to each of the light emitting portions 71, 72, and 73 one-to-one.

In an exemplary embodiment, a distance between the electrode placement portions 51, 52, and 53 and the second transmission portion 90 may be substantially the same as a distance between the light emitting portions 71, 72, and 73 and the first transmission portion 80. For example, distances between each of the first to third electrode placement portions 51, 52, and 53 and the second transmission portion 90 may be substantially the same as distances between each of the first to third light emitting portions 71, 72, and 73 and the first transmission portion 80, respectively.

In an exemplary embodiment, distances between the electrode placement portions 51, 52, and 53 may be substantially the same as distances between the light emitting portions 71, 72, and 73. For example, a distance between the first electrode placement portion 51 and the second electrode placement portion 52 and a distance between the second electrode placement portion 52 and the third electrode placement portion 53 may be substantially the same as a distance between the first light emitting portion 71 and the second light emitting portion 72 and a distance between the second light emitting portion 72 and the third light emitting portion 73, respectively.

Referring to FIGS. 4 and 5, the OLED device according to an exemplary embodiment of the present inventive concept may include the substrate 100, an opposing substrate 200, and a pixel circuit PC, a driving circuit DC, the voltage transmissive line 130, an organic light emitting element, a third electrode 150, an encapsulation structure 190, etc. which are disposed therebetween.

The substrate 100 may be substantially the same as or similar to the substrate 100 described with reference to FIGS. 1 to 3. In other words, the substrate 100 may include the display region 10 including the plurality of pixel regions 70, and the peripheral region 20 including the plurality of corresponding regions. Further, each of the pixel regions 70 may include the first transmission portion 80 and at least one light emitting portion 71, 72, and 73, and each of the corresponding regions may include the second transmission portion 90 and at least one electrode placement portion 51, 52, and 53.

A buffer layer 105 may be disposed on the substrate 100. The buffer layer 105 may block the permeation of impurities, and may have a substantially top surface. In an exemplary embodiment, the buffer layer 105 may be omitted.

The pixel circuit PC and the driving circuit DC may be disposed on the buffer layer 105. The pixel circuit PC may include a first transistor 110 disposed in the display region 10. FIG. 4 illustrates that the pixel circuit PC includes one transistor 110, however, the present inventive concept is not limited thereto. For example, the pixel circuit PC may include two or more transistors, at least one capacitor, the scan lines (S1 to Sn), the light emitting control lines (E1 to En), the data lines (D1 to Dm), or the like.

The driving circuit DC may include a second transistor 115, the first line 122, and the second line 132 which are disposed in the peripheral region 20. The second transistor 115 may compose the scan driving circuit 30 or the light emitting control circuit 35. The first and the second lines 122 and 132 may compose lines for transmitting the driving power signal and the control signal to the scan driving circuit 30 and the light emitting control circuit 35, and may compose an initialization voltage transmissive line for transmitting the initialization voltage.

The first transistor 110 may include a first active pattern 111, a first gate electrode 112, a first source electrode 113, and a first drain electrode 114. The second transistor 115 may include a second active pattern 116, a second gate electrode 117, a second source electrode 118, and a second drain electrode 119.

The active patterns 110 and 115 may be formed of single crystal silicon, polycrystalline silicon, or an oxide semiconductor. The first active pattern 111 may include a first source region and a first drain region which are doped with impurities, and a first channel region disposed therebetween. The second active pattern 116 may include a second source region and a second drain region which are doped with impurities, and a second channel region disposed therebetween.

A gate insulation layer 120 may be disposed to cover the active patterns 111 and 116. The gate electrodes 112 and 117 may be disposed on the gate insulation layer 120. In an exemplary embodiment, the gate electrodes 112 and 117 may overlap the channel regions of the active patterns 111 and 116, respectively.

The first line 122 may be disposed on the gate insulation layer 120. The first line 122 and the gate electrodes 112 and 117 may be formed by using substantially the same process. Accordingly, the first line 122 may include a material substantially the same as those of the gate electrodes 112 and 117, and the first line 122 may be formed on substantially the same level with the gate electrodes 112 and 117. The first line 122 may not overlap the second transmission portion 90 in the peripheral region 20.

An insulation interlayer 125 may be disposed to cover the gate electrodes 112 and 117, and the first line 122. The source electrodes 113 and 118, and the drain electrodes 114 and 119 may be disposed on the insulation interlayer 125. The source electrodes 113 and 118, and the drain electrodes 114 and 119 may pass through the insulation interlayer 125 and the gate insulation layer 120, and may be electrically connected to the source regions and the drain regions, respectively.

FIG. 4 illustrates that the buffer layer 105, the gate insulation layer 120, and the insulation interlayer 125 are formed in the first transmission portion 80 and the second transmission portion 90, however, the present inventive concept is not limited thereto. For example, the buffer layer 105, the gate insulation layer 120, and the insulation interlayer 125 may be disposed not to overlap the first transmission portion 80 and the second transmission portion 90. Accordingly, light transmittances of the first transmission portion 80 and the second transmission portion 90 may be improved.

The second line 132 and the voltage transmissive line 130 may be disposed on the insulation interlayer 125. The second line 132, the voltage transmissive line 130, the source electrodes 113 and 118, and the drain electrodes 114 and 119 may be formed by using substantially the same process. Accordingly, the second line 132 and the voltage transmissive line 130 may include a material substantially the same as those of the source electrodes 113 and 118, and the drain electrodes 114 and 119, and the second line 132 and the voltage transmissive line 130 may be formed on substantially the same level with the source electrodes 113 and 118, and the drain electrodes 114 and 119. The second line 132 and the voltage transmissive line 130 may not overlap the second transmission portion 90 in the peripheral region 20.

The wiring portion 50 may not overlap the second transmission portion 90 in the peripheral region 20. The voltage transmissive line 130 may be disposed in the wiring portion 50. In an exemplary embodiment, the driving circuit DC may be spaced apart from the voltage transmissive line 130 in the first direction. For example, the driving circuit DC may be spaced apart from the wiring portion 50 with respect to the second transmission portion 90.

The pixel circuit may not overlap the first transmission portion 80 in the display region 10, and the driving circuit DC and the voltage transmissive line 130 may not overlap the second transmission portion 90 in the peripheral region 20. In other words, the first transistor 110 may not overlap the first transmission portions 80, and the second transistor 115 and the lines 122, 130, and 132 may not overlap the second transmission portions 90, thereby not reducing light transmittances of the first and the second transmission portions 80 and 90. Accordingly, the first transistor 110, the second transistor 115, and the lines 122, 130, and 132 may not be recognized by a user.

A passivation layer 135 may be disposed on the insulation interlayer 125 to cover the transistors 110 and 115, and the lines 130 and 132. In an exemplary embodiment, the passivation layer 135 may have a substantially flat top surface. For example, the passivation layer 135 may include an organic material such as acryl, polyimide, benzocyclobutane (BCB), or the like.

The organic light emitting element including a first electrode 140, an organic layer structure 170 and a second electrode 180, and the third electrode 150 may be disposed on the passivation layer 135.

The first electrode 140 may be disposed in the display region 10. The first electrode 140 may pass through the passivation layer 135, and may be electrically connected to the first transistor 110. The first electrode 140 may be patterned as an island shape to be separated per the light emitting portion 71, 72, and 73 as illustrated in FIG. 3. In an exemplary embodiment, the first electrode 140 may be disposed to correspond to the light emitting portions 71, 72, and 73. For example, the first electrode 140 may include first electrode patterns each having an island shape corresponding to each of the light emitting portions 71, 72, and 73. Thus, the first electrode 140 may not be disposed in the first transmission portion 80. The first electrode 140 may include a transparent conductive material such as indium zinc oxide (IZO), indium tin oxide (ITO), or the like.

The third electrode 150 may be disposed in the peripheral region 20. The third electrode 150 may be patterned as an island shape to be separated per the electrode placement portion 51, 52, and 53 as illustrated in FIG. 3. In an exemplary embodiment, the third electrode 150 may be disposed to correspond to the electrode placement portions 51, 52, and 53. For example, the third electrode 150 may include third electrode patterns each having an island shape corresponding to the each of the electrode placement portions 51, 52, and 53. Thus, the third electrode 150 may not be disposed in the second transmission portion 90. In an exemplary embodiment, the third electrode 150 may be patterned to have a shape substantially the same as or similar to that of the first electrode 140.

The third electrode 150 may be formed by using a process substantially the same as a process used to form the first electrode 140. Therefore, the third electrode 150 may have substantially the same material with the first electrode 140, and may be formed on substantially the same level with the first electrode 140.

In a conventional OLED device, an organic layer structure including an organic light emitting layer may be degraded by residual gases in a passivation layer formed of an organic material. Thus, a pixel shrinkage may be occurred. To solve the pixel shrinkage in the conventional OLED device, out-gassing holed for emitting the residual gases out of the passivation layer may be formed in a pixel defining layer. However, a pixel electrode layer disposed on the passivation layer may be substantially entirely formed in a peripheral region, thus it is hard to emit the residual gases in the passivation layer in the peripheral region our of the passivation layer in the peripheral region. Accordingly, the organic layer structure including the organic light emitting layer in an edge of the display region may be degraded, and the pixel shrinkage may be occurred.

To solve this problem, in the OLED device according to an exemplary embodiment of the present inventive concept, the third electrode 150 disposed in the peripheral region 20 may be patterned as an island shape to be separated, thereby inducing an effective out-gassing and decreasing or substantially preventing the pixel shrinkage.

As illustrated in FIG. 5, the first electrode 140 may be patterned as an island shape to be separated per the light emitting portion 71, 72, and 73 in the display region 10, and the third electrode 150 may be patterned as an island shape to be separated per the electrode placement portion 51, 52, and 53 in the peripheral region 20. Thus, residual gases RG in the passivation layer 135 may be out-gassed between the third electrode patterns, and the pixel shrinkage may be decreased or substantially prevented.

Referring to FIG. 4 again, in an exemplary embodiment, the third electrode 150 may include a voltage transmissive electrode 152 and an auxiliary electrode 154.

The voltage transmissive electrode 152 may pass through the passivation layer 135, and may be electrically connected to the voltage transmissive line 130. The voltage transmissive electrode 152 may be disposed to correspond to the wiring portion 50. For example, the voltage transmissive electrode 152 may overlap the voltage transmissive line 130. The voltage transmissive electrode 152 may be disposed between the voltage transmissive line 130 and the second electrode 180, and may transmit the common voltage from the voltage transmissive line 130 to the second electrode 180.

The auxiliary electrode 154 may be disposed on the passivation layer 135. In an exemplary embodiment, the auxiliary electrode 154 may be disposed in the peripheral region 20 outside the wiring portion 50. A portion of the auxiliary electrode 154 may overlap the second transistor 115 and the lines 122 and 132. For example, the auxiliary electrode 154 may be formed to be spaced apart from the voltage transmissive electrode 152 in the first direction. By the formation of the auxiliary electrode 154, a difference of reflectivity between the display region 10 and the peripheral region 20 may be reduced, and the display region 10 and the peripheral region 20 may not be differently recognized by a user.

A pixel defining layer 165 may be disposed on the passivation layer 135. The pixel defining layer 165 may partially cover the first electrode 140 and the voltage transmissive electrode 152 of the third electrode 150. The pixel defining layer 165 may entirely cover the auxiliary electrode 152 of the third electrode 150. In an exemplary embodiment, the pixel defining layer 165 may partially overlap the transmission portions 80 and 90.

In an exemplary embodiment, the passivation layer 135 and the pixel defining layer 165 may not overlap the first transmission portion 80 and the second transmission portion 90. Therefore, light transmittances of the first transmission portion 80 and the second transmission portion 90 may be improved.

The organic layer structure 170 may include at least one organic light emitting layer. Alternatively, the organic layer structure 170 may further include a hole injection layer, a hole transport layer, an electron injection layer, and/or an electron transport layer. In an exemplary embodiment, the organic light emitting layer may emit red, green, or blue light. For example, the organic light emitting layer in the first light emitting portion 71 may emit a red light, the organic light emitting layer in the second light emitting portion 72 may emit a green light, and the organic light emitting layer in the third light emitting portion 73 may emit a blue light.

The second electrode 180 may be formed on the organic layer structure 170, the pixel defining layer 165, and the voltage transmissive electrode 152. In an exemplary embodiment, the second electrode 180 may partially overlap the transmission portions 80 and 90, or may entirely overlap the transmission portions 80 and 90. In another exemplary embodiment, the second electrode 180 may not overlap the transmission portions 80 and 90. For example, the second electrode 180 may include a metal such as aluminum (Al), platinum (Pt), silver (Ag), gold (Au), magnesium (Mg), chromium (Cr), tungsten (W), molybdenum (Mo), titanium (Ti), and an alloy thereof. The second electrode 180 may have a relatively thin thickness so that the second electrode 180 may have relatively high light transmittance. As illustrated above, the second electrode 180 may be in contact with the voltage transmissive electrode 152 at the wiring portion 50 in the peripheral region 20, and may receive the common voltage from the voltage transmissive electrode 152.

A capping layer (not illustrated) may be disposed on the second electrode 180. The capping layer may extend from the display region 10 to the peripheral region 20. The capping layer may protect the organic light emitting element, and may reduce or substantially prevent the refraction of light.

The encapsulation structure 190 may be disposed on the capping layer. The encapsulation structure 190 may encapsulate the organic light emitting element disposed between the substrate 100 and the encapsulation structure 190. In an exemplary embodiment, the encapsulation structure 190 may include a first organic layer 192, a first inorganic layer 194, a second organic layer 196, and a second inorganic layer 198.

The inorganic layers 194 and 198 may prevent moisture and/or oxygen from penetrating into the organic light emitting element. The organic layers 192 and 196 may alleviate inner stress of the inorganic layers 194 and 198, and may fill fine cracks and pinholes of the inorganic layers 194 and 198. In an exemplary embodiment, the organic layers 192 and 196 may include a transparent material such as epoxy-based resins, acrylic resins, perylene resins, polyimide resin, or a mixture thereof. The inorganic layers 194 and 198 may include a transparent material such as silicon nitride, aluminum nitride, zirconium nitride, titanium nitride, hafnium nitride, tantalum nitride, silicon oxide, aluminum oxide, titanium oxide, tin oxide, cerium oxide, silicon oxy-nitride, etc.

The opposing substrate 200 may be disposed opposite to the substrate 100. The opposing substrate 200 may include a transparent insulation substrate. For example, the opposing substrate 200 may include a glass substrate, a quartz substrate, a transparent resin substrate, or the like. Alternatively, the opposing substrate 200 may include a flexible substrate.

A filler 210 may be disposed between the substrate 100 and the opposing substrate 200. The filler 210 may include an organic material such as an urethane-based resin, a methacrylate resin, an acrylic resin a polyisoperene, a vinyl resin, an epoxy resin and a cellulose-based resin. The filler 210 may substantially prevent or reduce penetration of oxygen and/or moisture, and may fixate the substrate 100 and the opposing substrate 200.

Figure 6:
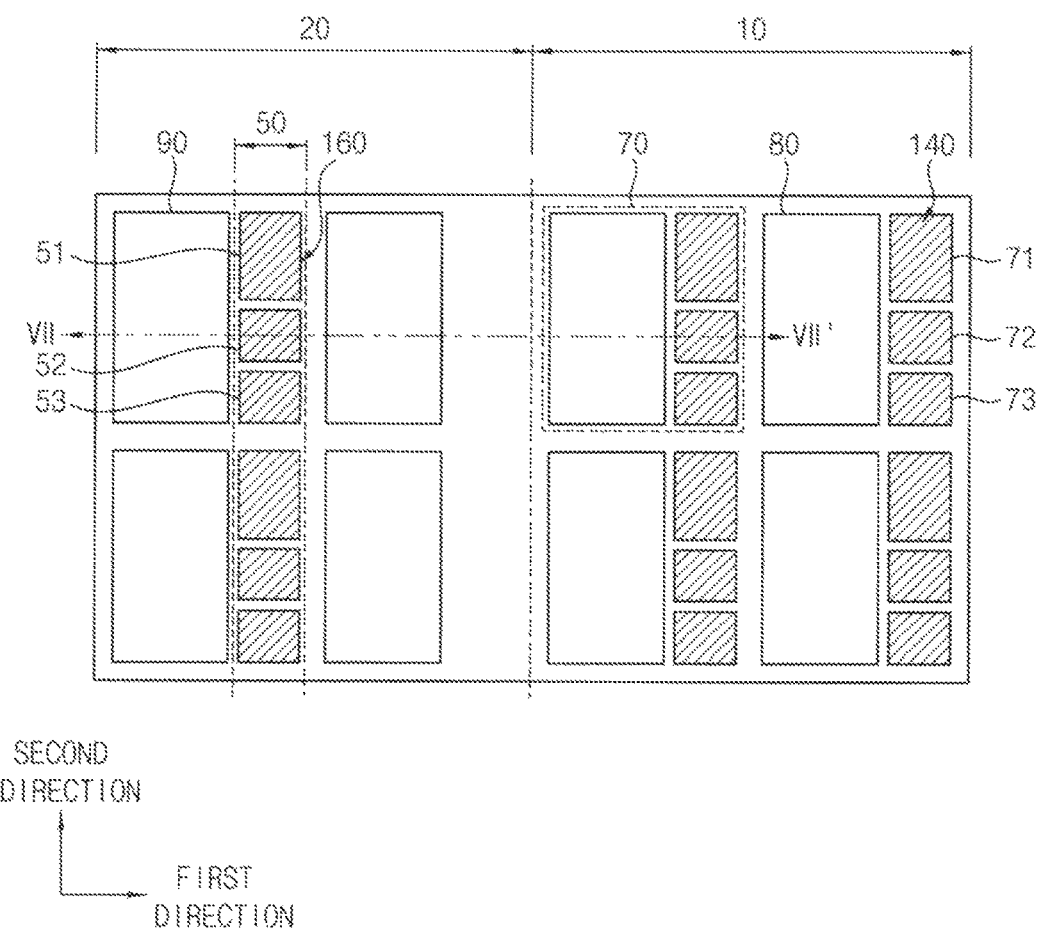
FIG. 6 is a plan view enlarging a portion III in FIG. 1 to describe an OLED device according to another exemplary embodiment of the present inventive concept.
Figure 7:
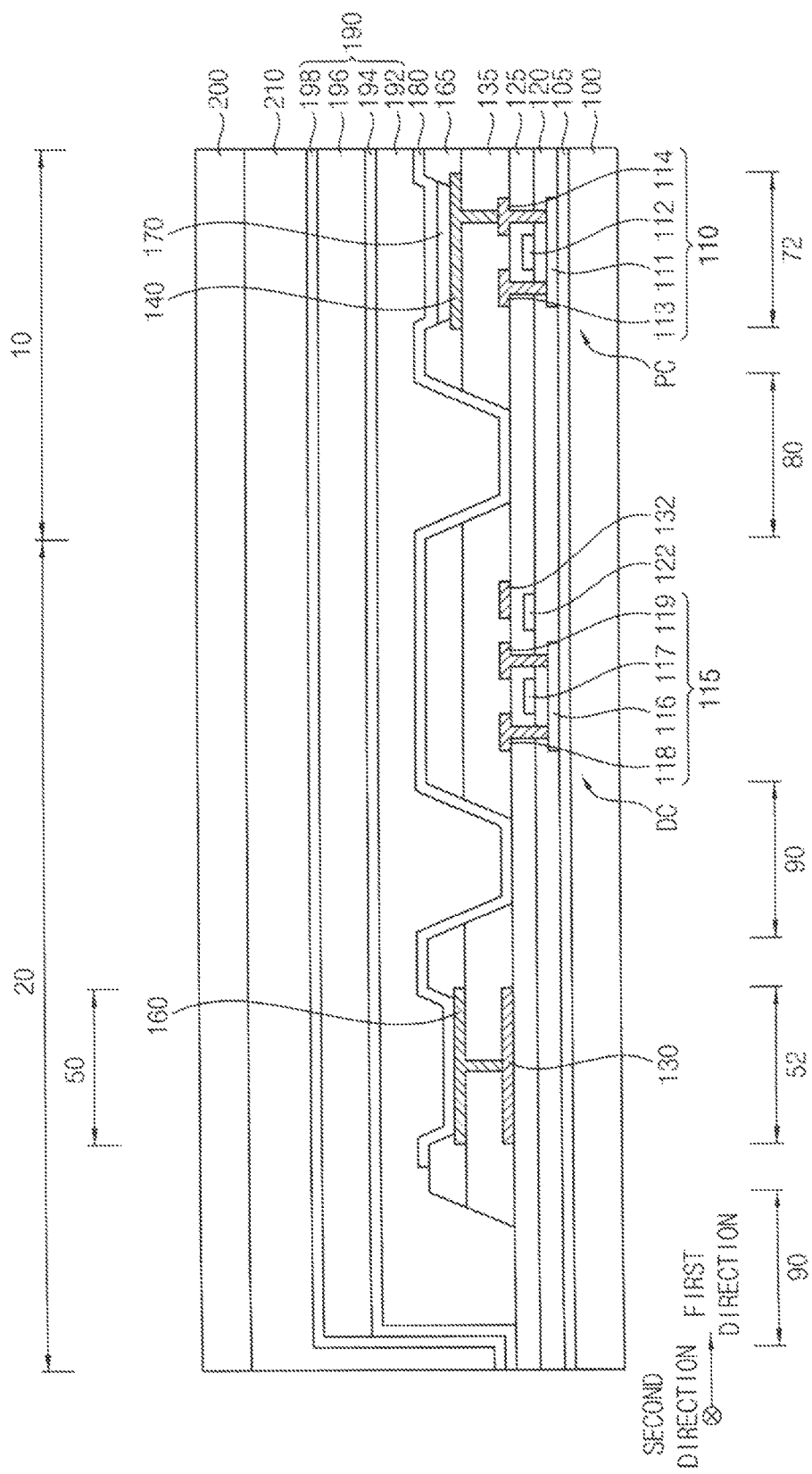
FIG. 7 is a cross-sectional view cut along a line VII-VII' in FIG. 6.

FIGS. 6 and 7 are plan view and cross-sectional view for describing an OLED device according to another exemplary embodiment. That is, FIG. 6 is a plan view enlarging a portion III in FIG. 1 to describe an OLED device according to another exemplary embodiment of the present inventive concept, and FIG. 7 is a cross-sectional view cut along a line VII-VII' in FIG. 6.

Referring to FIGS. 6 and 7, the OLED device according to another exemplary embodiment of the present inventive concept may include a substrate 100, an opposing substrate 200, and a pixel circuit PC, a driving circuit DC, a voltage transmissive line 130, an organic light emitting element, a third electrode 160, an encapsulation structure 190, etc. which are disposed therebetween.

The OLED device according to another exemplary embodiment of the present inventive concept may be substantially the same as or similar to the OLED device according to an exemplary embodiment with reference to FIGS. 1 to 5 except the structure of the third electrode 160. Description of repeated structures and compositions may be omitted.

In an exemplary embodiment, the third electrode 160 may be disposed in the wiring portion 50 in the peripheral region 20. For example, the third electrode 160 may be disposed only in the wiring portion 50, and may not be disposed outside the wiring portion 50. The third electrode 160 may be substantially the same as or similar to the voltage transmissive electrode 152 of the third electrode 150 described with reference to FIGS. 3 and 4.

The third electrode 160 may pass through the passivation layer 135, and may be electrically connected to the voltage transmissive line 130. The third electrode 160 may be disposed to correspond to the wiring portion 50. For example, the third electrode 160 may overlap the voltage transmissive line 130. The third electrode 160 may be disposed between the voltage transmissive line 130 and the second electrode 180, and may transmit the common voltage from the voltage transmissive line 130 to the second electrode 180.

The third electrode 160 may be disposed in the wiring portion 50, and may not be disposed outside the wiring portion 50. Thus, more effective out-gassing may be induced in the peripheral region 20, and a pixel shrinkage may be reduced or substantially prevented. As illustrated in FIG. 7, the third electrode 160 may not be formed on the passivation layer 135 in a remaining portion outside the wiring portion 50 in the peripheral region 20, thus residual gases may be more easily emitted out of the passivation layer 135.

Figure 8:
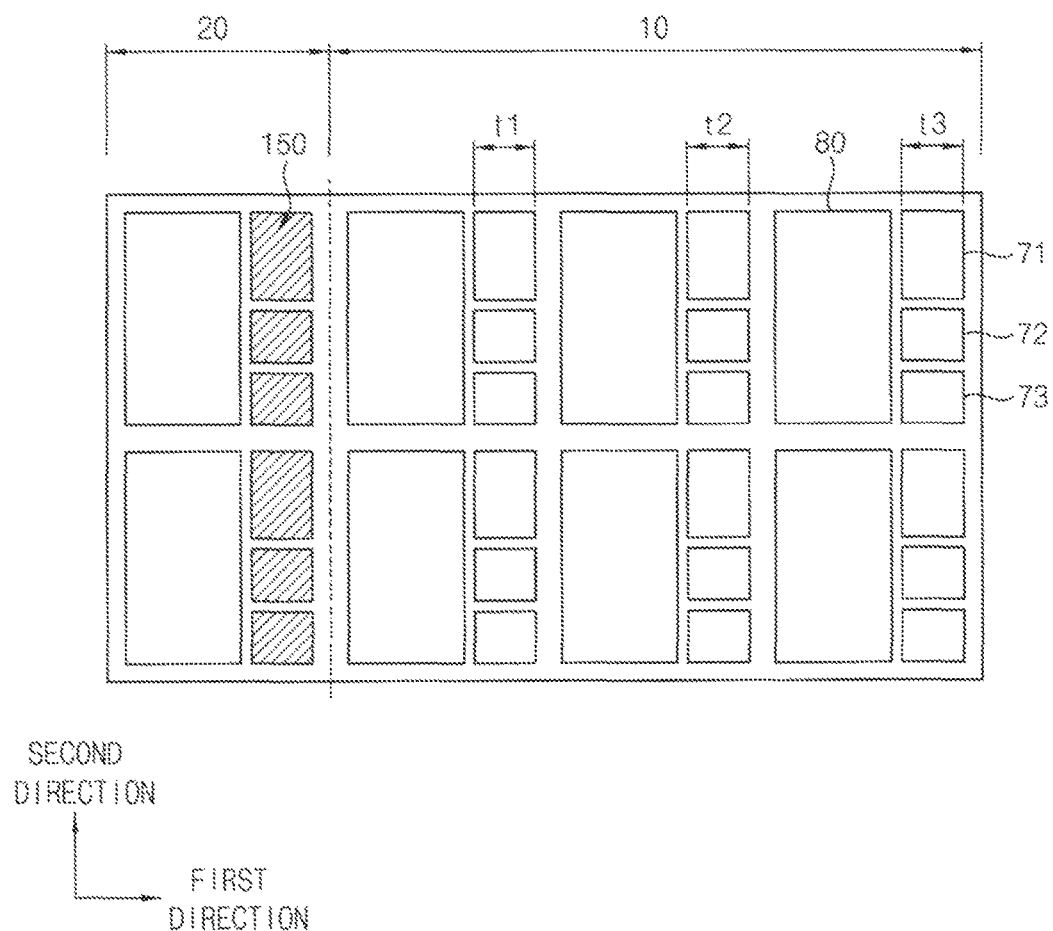
FIG. 8 is a plan view illustrating an OLED device according to an exemplary embodiment in which a third electrode is patterned as an island shape.
Figure 9:
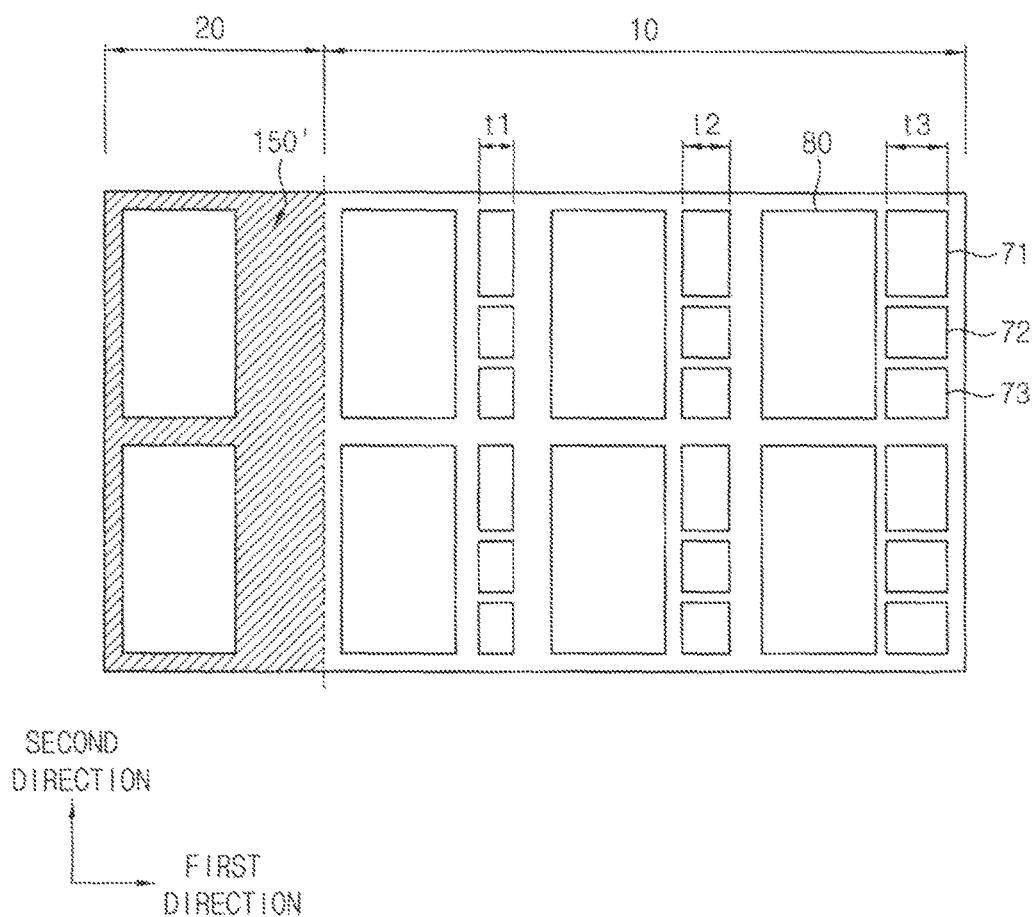
FIG. 9 is a plan view illustrating an OLED device according to a conventional comparative example in which a third electrode is not patterned.

FIG. 8 is a plan view illustrating an OLED device according to an exemplary embodiment in which a third electrode is patterned as an island shape. FIG. 9 is a plan view illustrating an OLED device according to a conventional comparative example in which a third electrode is not patterned.

As illustrated in FIG. 8, when the third electrode 150 disposed in the peripheral region 20 is patterned as an island shape, widths of organic light emitting layers may be uniformly formed even at an end portion of the display region 10, i.e., the leftmost side of the display region 10 in FIG. 8. For example, a width (t1) of an organic light emitting layer formed at the outermost portion of the display region 10 may be substantially the same as widths (t2 and t3) of organic light emitting layers internally formed (t1=t2=t3). The third electrode 150 may be patterned as an island shape so as to prevent a pixel shrinkage, thereby maintaining pixel uniformity.

On the contrary, as illustrated in FIG. 9, when the third electrode 150' disposed in the peripheral region 20 is not patterned, a pixel shrinkage may occur, in which a width of an organic light emitting layer decreases toward an end portion of the display region 10, i.e., leftmost side of the display region in FIG. 9. For example, a width t1 of an organic light emitting layer formed at an outermost portion of the display region 10, a width t2 of an organic light emitting layer, and a width t3 of an organic light emitting layer formed at the innermost portion of the display region 10, sequentially decrease (t1<t2<t3). Accordingly, a pixel shrinkage may occur, in which a width of an organic light emitting layer decreases toward an end portion of the display region 10, due to out-gassing generated from a passivation layer. Thus, the pixel shrinkage may continuously occur.

The third electrode 150 disposed in the peripheral region 20 may be patterned as an island shape so as to emit residual gases out of the passivation layer 135, thereby inducing effective out-gassing and reducing or substantially preventing the pixel shrinkage.

The OLED device according to exemplary embodiments of the present inventive concept may be applied to a display device included in a computer, a notebook, a mobile phone, a smartphone, a smart pad, a PMP, a PDA, an MP3 player, or the like.

Although the OLED device according to the exemplary embodiments of the present inventive concept has been described with reference to the drawings, the illustrated embodiment is an example, and may be modified and changed by a person having ordinary knowledge in the relevant technical field without departing from the technical spirit of the present inventive concept described in the following claims.

What is claimed is:

1. An organic light emitting display (OLED) device, the OLED device comprising:
   a substrate comprising a display region and a peripheral region surrounding at least one side of the display region, the display region comprising a first transmission portion and at least one light emitting portions, the peripheral region comprising a second transmission portion and at least one electrode placement portions;
   a pixel circuit on the substrate in the display region;
   a passivation layer in the display region and the peripheral region, the passivation layer covering the pixel circuit;
   a first electrode on the passivation layer in the display region, the first electrode being electrically connected to the pixel circuit;
   an organic light emitting layer on the first electrode;

a second electrode in the display region and the peripheral region, the second electrode opposite to the first electrode with respect to the organic light emitting layer; and a third electrode on the passivation layer in the peripheral region;

wherein the first electrode is patterned as an island shape to be separated per the at least one light emitting portion, and wherein the third electrode is patterned as an island shape that is a same as a shape of the first electrode to be separated per the at least one electrode placement portion.

2. The OLED device of claim 1, wherein the third electrode is not overlapped with the second transmission portion.

3. The OLED device of claim 1, wherein the first electrode and the third electrode are disposed on a same level on the substrate and formed of a same material.

4. The OLED device of claim 1, further comprising a voltage transmissive line disposed in a wiring portion in the peripheral region, the voltage transmissive line transmitting a common voltage to the second electrode.

5. The OLED device of claim 4, wherein the voltage transmissive line is not overlapped with the second transmission portion.

6. The OLED device of claim 4, wherein the pixel circuit comprises an active pattern, a gate electrode insulated from the active pattern, and source and drain electrodes each connected to the active pattern, and wherein the voltage transmissive line, and the source and drain electrodes are disposed on a same level on the substrate and formed of a same material.

7. The OLED device of claim 4, wherein the third electrode comprises a voltage transmissive electrode disposed in the wiring portion and an auxiliary electrode disposed in the peripheral region outside the wiring portion, and wherein the voltage transmissive electrode is disposed between the voltage transmissive line and the second electrode to electrically connect the voltage transmissive line and the second electrode.

8. The OLED device of claim 7, further comprising a driving circuit in the peripheral region.

9. The OLED device of claim 8, wherein the driving circuit comprises at least one of a scan driving circuit, a light emitting control circuit, and an initialization voltage transmissive line.

10. The OLED device of claim 8, wherein the driving circuit is not overlapped with the second transmission portion.

11. The OLED device of claim 8, wherein at least a portion of the auxiliary electrode is overlapped with the driving circuit.

12. The OLED device of claim 4, wherein the third electrode is disposed between the voltage transmissive line and the second electrode to electrically connect the voltage transmissive line and the second electrode.

13. The OLED device of claim 12, wherein the third electrode is disposed only in the wiring portion, and is not disposed in a remaining portion of the peripheral region, the remaining portion being outside the wiring portion.

14. The OLED device of claim 1, wherein an area of the first transmission portion is a same area as an area of the second transmission portion.

15. An OLED device, comprising:
a display region;
a peripheral region surrounding at least one side of the display region;
a first transmission portion in the display region;
a first light emitting portion spaced apart from the first transmission portion in the display region, the first light emitting portion comprising a first electrode, an organic light emitting layer, and a second electrode;
a second transmission portion in the peripheral region; and
a first electrode placement portion spaced apart from the second transmission portion in the peripheral region, the first electrode placement portion comprising a third electrode,
wherein a distance between the second transmission portion and the first electrode placement portion is a same distance as a distance between the first transmission portion and the first light emitting portion.

16. The OLED device of claim 15, wherein a shape of the second transmission portion and a shape of the first electrode placement portion are respectively each of same shapes as a shape of the first transmission portion and a shape of the first light emitting portion.

17. The OLED device of claim 15, further comprising:
a second light emitting portion spaced apart from the first transmission portion and the first light emitting portion in the display region, the second light emitting portion comprising the first electrode, the organic light emitting layer, and the second electrode; and
a second electrode placement portion spaced apart from the second transmission portion and the first electrode placement portion in the peripheral region, the second electrode placement portion comprising the third electrode.

18. The OLED device of claim 17, wherein a distance between the second transmission portion and the second electrode placement portion is a same distance as a distance between the first transmission portion and the second light emitting portion.

19. The OLED device of claim 17, wherein a distance between the first electrode placement portion and the second electrode placement portion is a same distance as a distance between the first light emitting portion and the second light emitting portion.

20. The OLED device of claim 17, wherein a shape of the first electrode placement portion and a shape of the second electrode placement portion are respectively each of same shapes as a shape of the first light emitting portion and a shape of the second light emitting portion.

* * * * *